US012701670B2

(12) United States Patent
Mundt et al.

(10) Patent No.: US 12,701,670 B2
(45) Date of Patent: Aug. 4, 2026

(54) RISER AS A BRIDGE BETWEEN ADD-IN CARDS OF AN INFORMATION HANDLING SYSTEM

(71) Applicant: DELL PRODUCTS L.P., Round Rock, TX (US)

(72) Inventors: Kevin Mundt, Livingston, TX (US); Stephen Strickland, Foxborough, MA (US); Anand Nunna, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 135 days.

(21) Appl. No.: 18/649,102

(22) Filed: Apr. 29, 2024

(65) Prior Publication Data

US 2025/0338423 A1    Oct. 30, 2025

(51) Int. Cl.
　　*G06F 13/00*　　(2006.01)
　　*G06F 1/183*　　(2026.01)
　　*H05K 7/14*　　(2006.01)
(52) U.S. Cl.
　　CPC ........... *H05K 7/1461* (2013.01); *G06F 1/183* (2013.01)

(58) Field of Classification Search
None
See application file for complete search history.

(56) References Cited

U.S. PATENT DOCUMENTS

| | | | |
|---|---|---|---|
| 6,533,587 B1 * | 3/2003 | Potter | H01L 23/467 |
| 2015/0347345 A1 * | 12/2015 | Hellriegel | G06F 13/409 |
| | | | 710/301 |
| 2016/0070661 A1 * | 3/2016 | Huang | G06F 13/12 |
| | | | 710/33 |
| 2018/0189225 A1 | 7/2018 | Ramaswamy et al. | |
| 2022/0027302 A1 | 1/2022 | Smith et al. | |
| 2022/0046818 A1 * | 2/2022 | Placke | H05K 7/1492 |

* cited by examiner

*Primary Examiner* — Henry Tsai
*Assistant Examiner* — Dean Phan
(74) *Attorney, Agent, or Firm* — Larson Newman, LLP

(57) ABSTRACT

An information handling system includes first and second add-in cards and a riser printed circuit board (PCB). The first add-in card is configured to connect with a host system of the information handling system via a direct connection. The riser PCB includes first and second connectors. The first add-in card is in electrical communication with the riser PCB via the first connector. The second add-in card is in electrical communication with the riser PCB via the second connector. The first and second add-in cards are configured to communicate with each other via the first and second connectors and routing on the riser PCB.

20 Claims, 5 Drawing Sheets

To Host System

To Host System

RISER AS A BRIDGE BETWEEN ADD-IN CARDS OF AN INFORMATION HANDLING SYSTEM

FIELD OF THE DISCLOSURE

The present disclosure generally relates to information handling systems, and more particularly relates to a riser as a bridge between add-in cards of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes first and second add-in cards and a riser printed circuit board (PCB). The first add-in card may connect with a host system of the information handling system via a direct connection. The riser PCB includes first and second connectors. The first add-in card may be in electrical communication with the riser PCB via the first connector. The second add-in card may be in electrical communication with the riser PCB via the second connector. The first and second add-in cards may communicate with each other via the first and second connectors and routing on the riser PCB.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
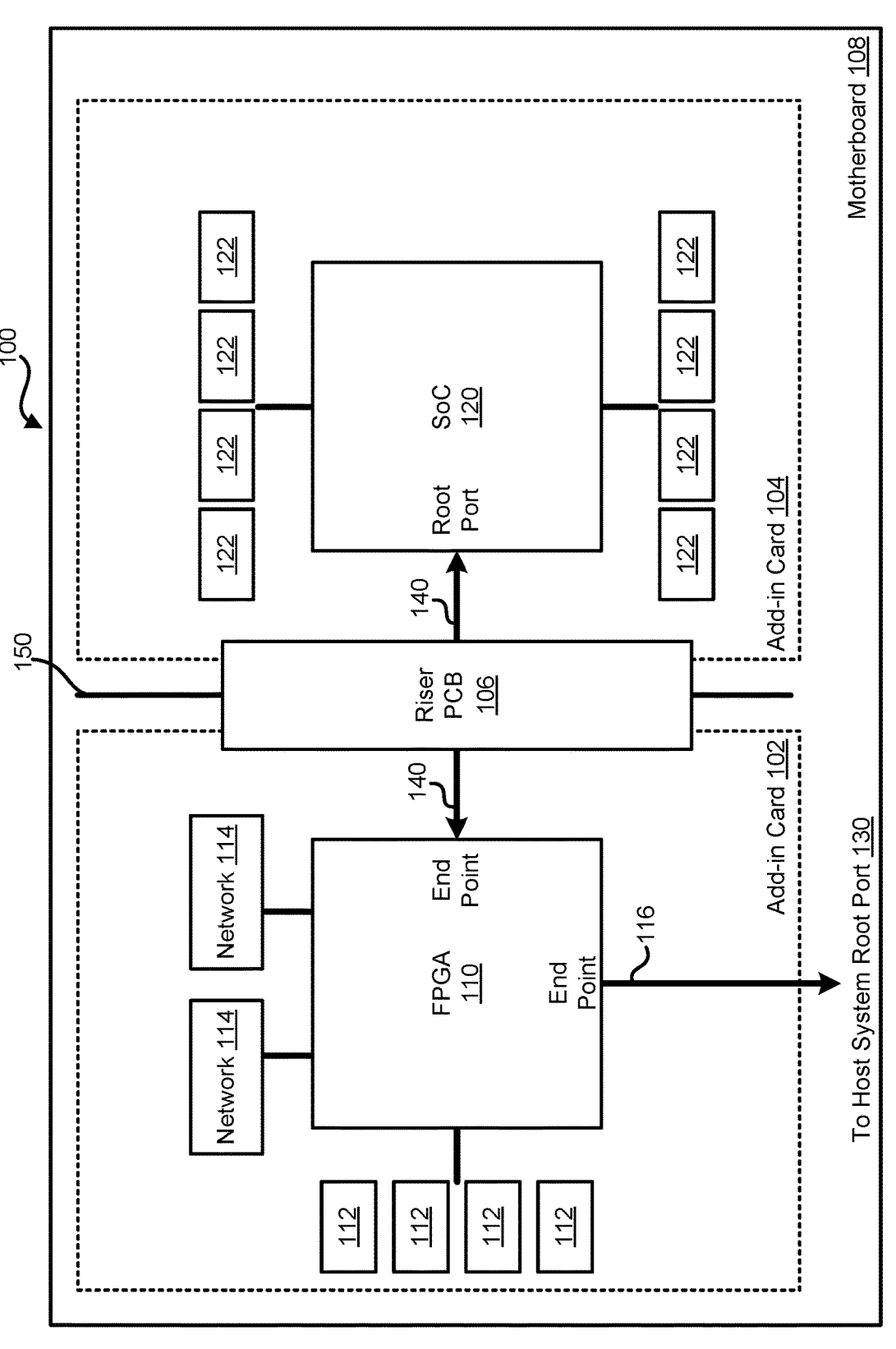
FIG. 1 is a block diagram of a portion of an information handling system according to at least one embodiment of the present disclosure.

FIG. 1 illustrates an information handling systems 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes add-in cards 102 and 104, a riser printed circuit board (PCB) 106, and a motherboard 108. Add-in cards 102 and 104 may be any suitable type of add-in cards including, but not limited to, peripheral component interconnect express (PCIe) cards. In an example, the PCIe cards may be smart network interface cards (smartNICs), data processing units (DPUs), infrastructure processing units (IPUs), or the like. In certain examples, the PCIe add-in cards may include different integrated circuits (ICs) and other components. Add-in card 102 includes a field programmable gate array (FPGA) IC 110, multiple memory devices 112, and multiple network connectors 114, and a PCIe link or bus 116. Add-in card 104 includes a system on a chip (SoC) IC 120 and multiple memory devices 122. Motherboard 108 includes a host system 130 in communication with add-in card 102 via PCIe link or bus 116. Information handling system 100 further includes a PCIe bus 140 between FPGA 110 and SoC 120, and the PCIe bus may extend or be routed through riser PCB 106. Information handling system 100 further includes a power rail or bus 150 that the riser PCB may utilize to receive power from a power supply unit of the information handling system. Information handling system 100 may include additional components without varying from the scope of this disclosure.

In certain examples, add-in cards 102 and 104 may include multiple power-hungry components including, but not limited to, FPGA 110, network connectors 114, and SoC 120. In previous information handling systems, the arrangement of these components may create system integration problems. For example, the components on the previous PCIe add-in cards may drive an extended card length that would not fit withing the bounds of many servers. As an example, a 1U server cannot utilize a PCIe form factor card longer than one half length. However, many multi-component add-in cards are now three-quarter length or full length and as such do not fit in servers with add-in card length restrictions.

Previous multi-component PCIe cards may place components in a serial fashion along the length of the card. In these previous serial fashion PCIe cards, each downstream component may receive pre-heated air from the previous component. However, the network connectors, at the rear bulkhead of the system, are particularly sensitive to heat. In previous PCIe cards, a common mitigation solution was to implement a tall heatsink creating a double-wide (DW) PCIe card. However, this previous configuration creates a physical fit problem because the thick cards do not fit in many servers including the 1U servers.

Figure 2:
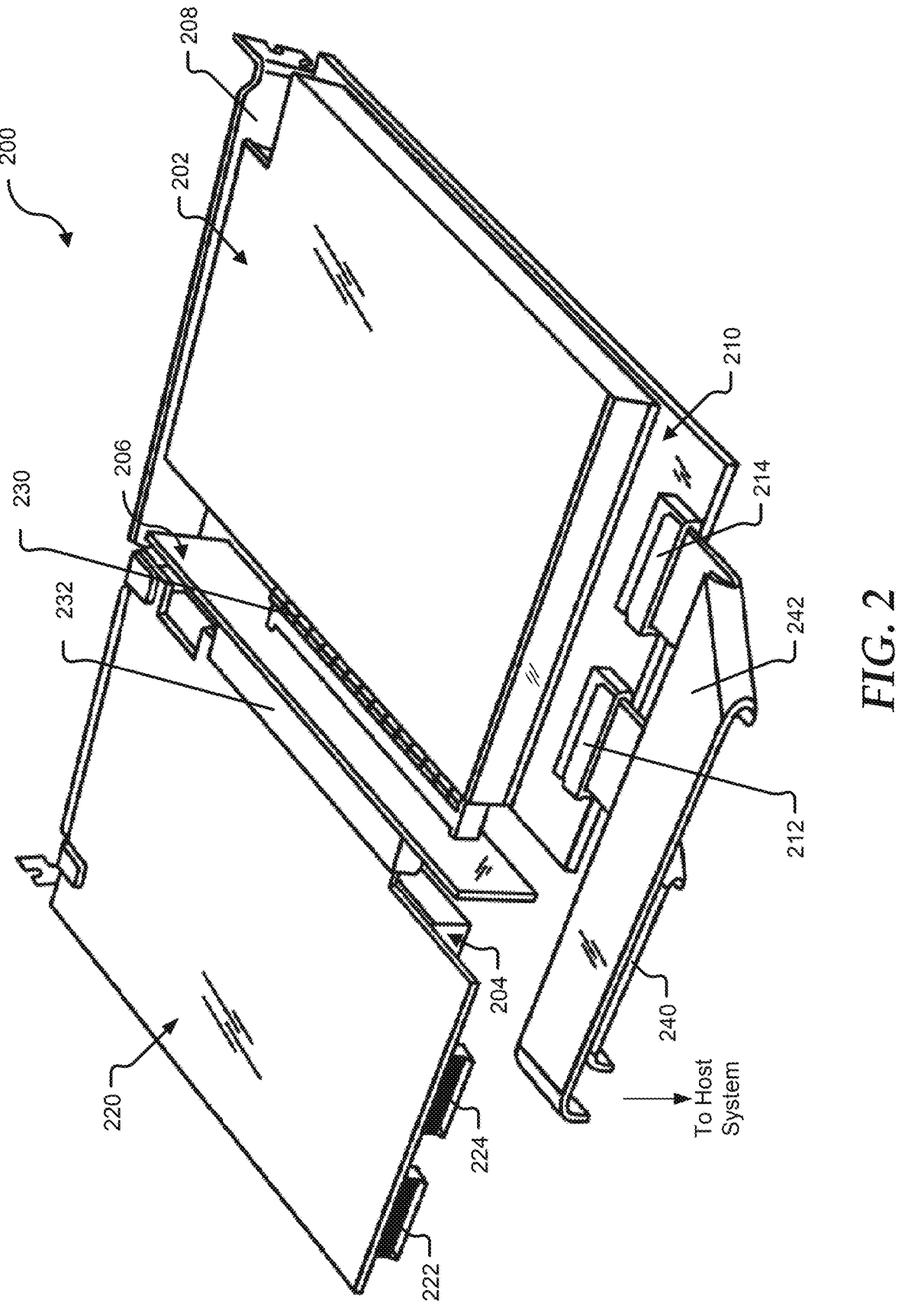
FIG. 2 is a diagram of a portion of an information handling system with add-in cards in a second configuration on a riser according to at least one embodiment of the present disclosure.
Figure 3:
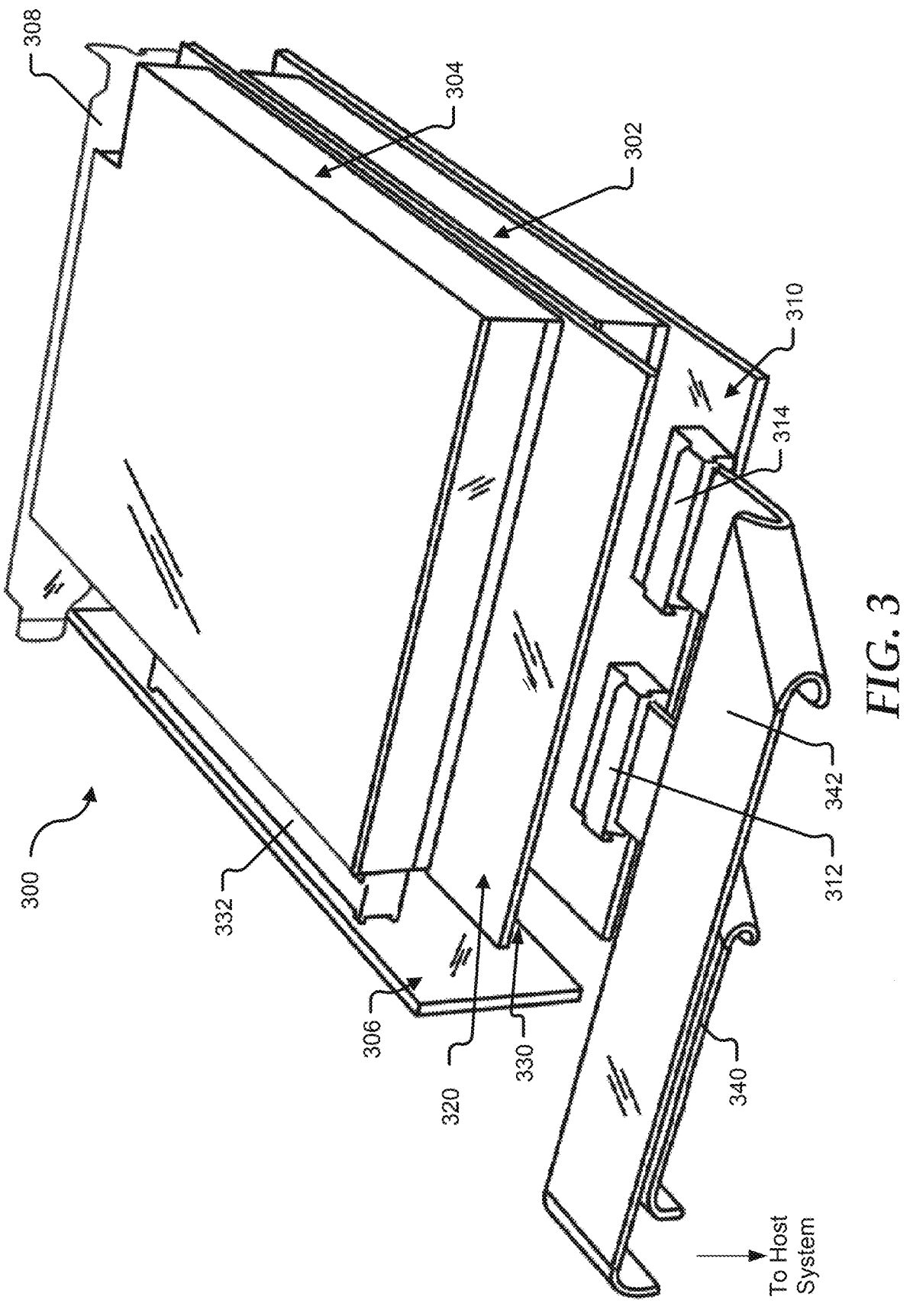
FIG. 3 is a diagram of a portion of an information handling system with add-in cards in a second configuration on a riser according to at least one embodiment of the present disclosure.

In an example, utilizing riser PCB 106 as a bridge between add-in cards 102 and 104 improves information handling system 100 may enabling the add-in cards to fit within PCIe form factors and maintaining the half-length requirements of many server expansion bays. For example, add-in cards 102 and 104 may be deployed in different configurations. One configuration for add-in cards 102 and 104 may be a butterfly configuration for 1U servers as illustrated in FIG. 2 and a side-by-side or stacked configuration for 2U servers as illustrated in FIG. 3.

As illustrated in FIG. 1, only FPGA 110 on add-in card 102 may be connected to host system 130. In this configuration, riser PCB 106 and add-in card 104 do not have a direct cable connection to host system 130. In an example, the PCIe lanes of SoC 120 on add-in card 104 may be connected to FPGA 110 via riser PCB 106. For example, both add-in cards 102 and 104 may be connected to riser PCB 102 via respective PCIe connectors. In an example, the PCIe connectors on riser PCB 102 may provide any suitable number of lanes, such as x8 lanes, x16 lanes, or the like. One of ordinary skill will recognize that the number of PCIe lanes may change as technology and add-in cards 102 and 104 needs change.

In certain examples, information handling system 100 may be a multiple host system. For example, the different hosts within information handling system 100 may be host system 130 on motherboard 108 and SoC 120 as a host on add-in card 104. In this example, FPGA 110 on add-in card 102 may be the endpoint for both host system 130 and SoC 120. In an example, SoC 120 of add-in card 104 may be a host system for information handling system 100 connected to endpoint of FPGA 110 on add-in card 102. Additionally, host system 130 may be a root port on motherboard 108 for endpoint on FPGA 110 of add-in card 102.

In certain examples, communication bus 116 between FPGA 110 and host system 130 may be any suitable connection including, but not limited to, PCIe lanes form by the card edge contacts and cabled PCIe lanes. In an example, FPGA 110 may be the endpoint for the root port of host system 130 on motherboard 108. In this example, communication between the endpoint on FPGA 110 and the root port 130 may be over cabled PCIe lanes of communication bus 116.

In certain examples, both add-in cards 102 and 104 may be connected to riser PCB 106 through respective connectors of the riser PCB card. In an example, the connectors of riser PCB 106 may enable add-in cards 102 and 104 to utilize the riser PCB card as a bridge between the add-in cards. For example, FPGA 110 may communicate with SoC 120 via communication bus 140. In certain examples, communication bus 140 between FPGA 110 and SoC 120 may be any suitable connection including, but not limited to, PCIe lanes. In an example, FPGA 110 may be the endpoint for the root port of SoC 120. In this example, communication between the endpoint on FPGA 110 and the root port on SoC 120 may be over PCIe lanes of communication bus 140 through bridge riser PCB 106. The communication from FPGA 110 to SoC 120 may be for any suitable operation, such as accessing memory devices 122 on add-in card 102. In certain examples, SoC 120 may communicate with FPGA 110 to access memory devices 112 or network connectors 114 on add-in card 102.

In an example, SoC 120 on add-in card 104 may communicate with system host 108 for any suitable operation. In this example, riser PCB 106 may be utilized as a bridge to send the communication from root port of SoC 120 on add-in card 104 to endpoint of FPGA 110 on add-in card 102 over PCIe communication bus 140. In response to receiving the communication, endpoint of FPGA 110 on add-in card 102 may provide the communication to root port of host system 130 on motherboard 108 via PCIe communication bus 116. Additionally, host system 130 may communicate with SoC 120 in the reverse direction. For example, root port of host system 130 may provide a communication to endpoint of FPGA 110 on add-in card 102 over communication bus 116 associated with add-in card 102. In response to receiving the communication, endpoint FPGA 110 may provide the communication to root port of SoC 120 on add-in card 104 via communication bus 140 in riser PCB 106.

In an example, riser PCB 106 may include PCIe communication connectivity to motherboard 108. In this example, the connectivity from riser PCB 106 to motherboard 108 may include any suitable number of PCIe lanes, such as x16 lanes. In this configuration, add-in cards 102 and 104 may include a processing device or devices that have both a root port and multiple endpoints. In an example, the connectors of riser PCB 106 may enable add-in cards 102 and 104 to use a portion of the PCIe lanes in communication bus 140 to utilize the riser PCB card as a bridge between the add-in cards. For example, FPGA 110 may communicate with SoC 120 via half of the PCIe lanes, such as x8 of x16 PCIe lanes, in communication bus 140.

In certain examples, FPGA 110 on add-in card 102 may be the endpoint for the root port of host system 130 on motherboard 108. In this example, communication between the endpoint on FPGA 110 and the root port 130 may be over cabled PCIe lanes of communication bus 116 and/or over half of the PCIe lanes, such as x8 of x16 PCIe lanes, of communication bus 140 and the communication bus between riser PCB 106 and the motherboard. In certain examples, FPGA 110 of add-in card 102 may be the endpoint for the root port of SoC 120. In this example, communication between the endpoint on FPGA 110 and the root port on SoC 120 may be over half of the PCIe lanes, such as x8 of x16 lanes, of communication bus 140 through bridge riser 106. Additionally, SoC 120 of add-in card 104 may be the endpoint for the root port of host system 130 on motherboard 108. In this example, communication between the endpoint on SoC 120 of add-in card 104 and the root port 130 on motherboard 108 may be over half of the PCIe lanes, such as x8 of x16 PCIe lanes, of communication bus 140 and the communication bus between riser PCB 106 and the motherboard.

In certain examples, riser PCB card 106 may plug into motherboard 108 of information handling system 100 and include connectors to receive add-in cards 102 and 104. Riser PCB card 106 may receive power from a power supply of information handling system 100, such as power supply unit 506 of FIG. 5, through motherboard 108 via power supply bus 150. In certain examples, riser PCB card 106 may provide the power to add-in cards 102 and 104 via respective connectors on the riser PCB card.

FIG. 2 illustrates a portion of an information handling system 200 according to at least one embodiment of the present disclosure. Information handling system 200 may be substantially similar to information handling system 100 of FIG. 1. Information handling system 200 includes add-in cards 202 and 204, a riser PCB 206, and a mounting component 208. In an example, add-in cards 202 and 204 may be any suitable cards, such as a FPGA card, a SoC card, or the like. In certain examples, add-in card 202 may be a FPGA card and add-in card 204 may be a SoC card. Add-in card 202 includes a PCB 210 and connectors 212 and 214. Add-in card 204 includes a PCB 220 and connectors 222 and 224. Riser PCB 106 includes connectors 230 and 232. In an example, a communication cable 240 may be plugged into connector 212 of add-in card 202. Similarly, a communication cable 242 may be plugged into connector 214 of add-in card 202. Information handling system 200 may include additional components without varying from the scope of this disclosure.

In an example, the mechanical layout of information handling system 200 may be a butterfly configuration, such that one of add-in cards 202 and 204 is connected to one side of riser PCB 106 and the other add-in card is connected to the other side of the riser PCB of the riser PCB. When add-in cards 202 and 204 are in the butterfly configuration, the add-in cards and riser PCB 206 may fit within a 1U slot of an information handling system, such as a server. In certain examples, add-in card 202 may be connected to riser PCB 206 via connector 230 and add-in card 204 may be connected to riser PCB 206 via connector 232. In an example, riser PCB 206 may provide power from a power supply unit of information handling system 200, such as power supply unit 506 of FIG. 5, to both add-in cards 202 and 204. The power may be provided via a set of pins in connectors 230 and 232.

In an example, riser PCB 206 may be a card-to-card PCIe passthrough via routing between connectors 230 and 232. In certain examples, add-in card 202 may connect to connector 230 via card edge contacts. In an example, the card edge contacts may be any suitable communication lanes, such as x16 PCIe lanes. In certain examples, cable connectors 212 and 214 may be any suitable communication protocol, such as x16 PCIe lanes. In an example, cables 240 and 242 may be x16 PCIe lane communication cables. Add-in card 202 may communicate with a host system of information handling system 200 via a communication path formed by connector 212 and cable 240 and by another communication path formed by connector 214 and cable 242.

In certain examples, add-in card 204 may or may not include connectors 222 and 224 without varying from the scope of this disclosure. If add-in card 204 includes connectors 222 and 224, these connectors may not have cables connected to them. Instead, communication from add-in card 204 to the host system may be provided through riser PCB 206 and add-in card 202. In certain examples, add-in card 204 may connect to connector 232 via card edge contacts. In an example, the card edge contacts may be any suitable communication lanes, such as x16 PCIe lanes. Add-in card 204 may communicate with a host system of information handling system 200 via a communication path formed by connector 232, riser PCB 206, connector 230, add-in card 202, and one or both of the combination of connector 212 and cable 240 and the combination of connector 214 and cable 242.

FIG. 3 illustrates a portion of an information handling system 300 according to at least one embodiment of the present disclosure. Information handling system 300 may be substantially similar to information handling system 100 of FIG. 1. Information handling system 300 includes add-in cards 302 and 304, a riser PCB 306, and a mounting component 308. In an example, add-in cards 302 and 304 may be any suitable cards, such as a FPGA card, a SoC card, or the like. In certain examples, add-in card 302 may be a FPGA card and add-in card 304 may be a SoC card. Add-in card 302 includes a PCB 310 and connectors 312 and 314. Add-in card 304 includes a PCB 320. Riser PCB 306 includes connectors 330 and 332. In an example, a communication cable 340 may be plugged into connector 312 of add-in card 302. Similarly, a communication cable 342 may be plugged into connector 314 of add-in card 302. Information handling system 300 may include additional components without varying from the scope of this disclosure.

In an example, the mechanical layout of information handling system 300 may be a stacked configuration, such that both of add-in cards 302 and 304 are connected to the same side of riser PCB 106 and add-in cards are stacked on top of each other. When add-in cards 302 and 304 are in the stacked configuration, the add-in cards and riser PCB 306 may fit within a 2U slot of an information handling system, such as a server. In certain examples, add-in card 302 may be connected to riser PCB 306 via connector 330 and add-in card 304 may be connected to riser PCB 306 via connector 332. In an example, riser PCB 306 may provide power from a power supply unit of information handling system 300, such as power supply unit 506 of FIG. 5, to both add-in cards 302 and 304. The power may be provided via a set of pins in connectors 330 and 332.

In an example, riser PCB 306 may be a card-to-card PCIe passthrough via routing between connectors 330 and 332. In certain examples, the routing on the riser PCB may be different based on the configuration of the add-in cards. For example, the routing between connectors 330 and 332 on riser PCB 306 may differ from the routing between connectors 230 and 232 on riser PCB 206 in FIG. 2. Add-in card 302 may connect to connector 330 via card edge contacts. In an example, the card edge contacts may be any suitable communication lanes, such as x16 PCIe lanes. In certain examples, cable connectors 312 and 314 may be any suitable communication protocol, such as x16 PCIe lanes. In an example, cables 340 and 342 may be x16 PCIe lane communication cables. Add-in card 302 may communicate with a host system of information handling system 300 via a communication path formed by connector 312 and cable 340 and by another communication path formed by connector 314 and cable 342.

In certain examples, add-in card 304 may communicate with the host system through riser PCB 306 and add-in card 302. In an example, add-in card 304 may connect to connector 332 via card edge contacts. In certain examples, the card edge contacts may be any suitable communication lanes, such as x16 PCIe lanes. Add-in card 304 may communicate with a host system of information handling system 300 via a communication path formed by connector 332, riser PCB 306, connector 330, add-in card 302, and one or both of the combination of connector 312 and cable 340 and the combination of connector 314 and cable 342.

Figure 4:
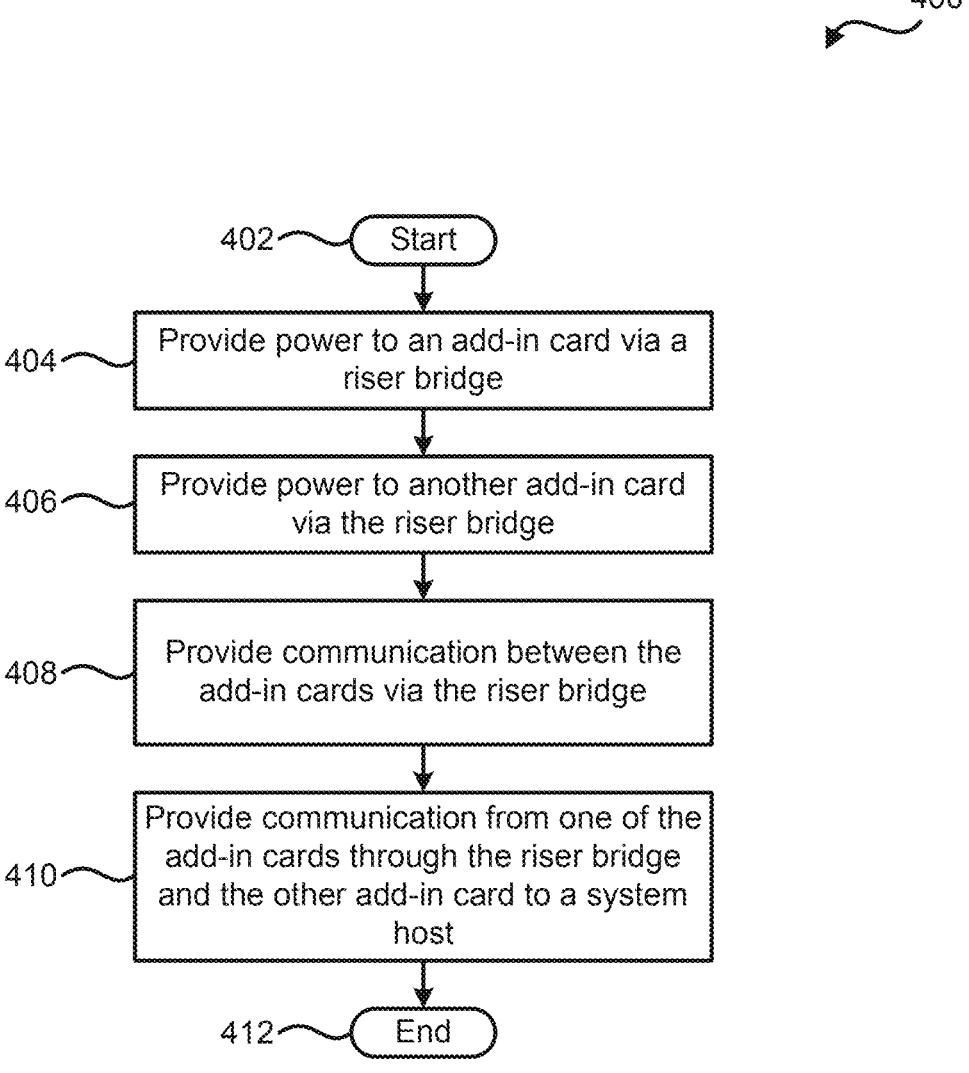
FIG. 4 is a flow diagram of a method for utilizing a riser as a bridge between add-in cards of an information handling system according to at least one embodiment of the present disclosure.

FIG. 4 is a flow diagram of a method 400 for utilizing a riser as a bridge between add-in cards of an information handling system according to at least one embodiment of the present disclosure, starting at block 402. It will be readily appreciated that not every method step set forth in this flow diagram is always necessary, and that certain steps of the methods may be combined, performed simultaneously, in a different order, or perhaps omitted, without varying from the scope of the disclosure. FIG. 4 may be employed in whole, or in part, riser PCB 106, FPGA 110, and SoC 140 of FIG. 1, or any other type of controller, device, module, processor, or any combination thereof, operable to employ all, or portions of, the method of FIG. 4.

At block 404, power is provided to an add-in card for an information handling system. In an example, the add-in card may be any suitable card that may be plugged into the information handling system, such as a FPGA card. At block 406, power is provided to another add-in card for the information handling system. In an example, the add-in card may be any suitable card that may be plugged into the information handling system, such as a SoC card. In certain examples, the power may be provided to the add-in cards via a riser PCB card within the information handling system. For example, the riser PCB card may be connected to a motherboard of the information handling system, which in turn may provide power from the power supply of the information handling system.

At block 408, communication is provided between the add-in cards. In an example, the communication may be provided via the riser PCB card. In this example, each of the add-in cards may be connected to the riser PCB card through respective connectors of the riser PCB card. In certain examples, the connectors of riser PCB card may enable the add-in cards to utilize the riser PCB card as a bridge between the add-in cards. In an example, the connectors may be PCIe lanes, such as x16 PCIe lanes, to enable PCIe communication between the add-in cards.

At block 410, a communication is provided from one of the add-in cards, through the riser PCB card, through the other add-in card, and then to a host system of the information handling system, and the flow ends at block 412. In an example, one of the add-in cards may not have a direct connection to the host system of the information handling system. However, the other add-in card may have a direct connection with the host system, such as through a cabled PCIe lane. In this situation, the add-in card without the direct connection with the host system may provide a communication through the PCIe passthrough of the riser car to the other add-in card, which in turn may provided the communication to the host system via a PCIe cable connector. Thus, the riser PCB card may be utilized as a bridge to enable communication between the add-in cards and communication with the host system with only one of the add-in cards having a PCIe connection to the host system.

Figure 5:
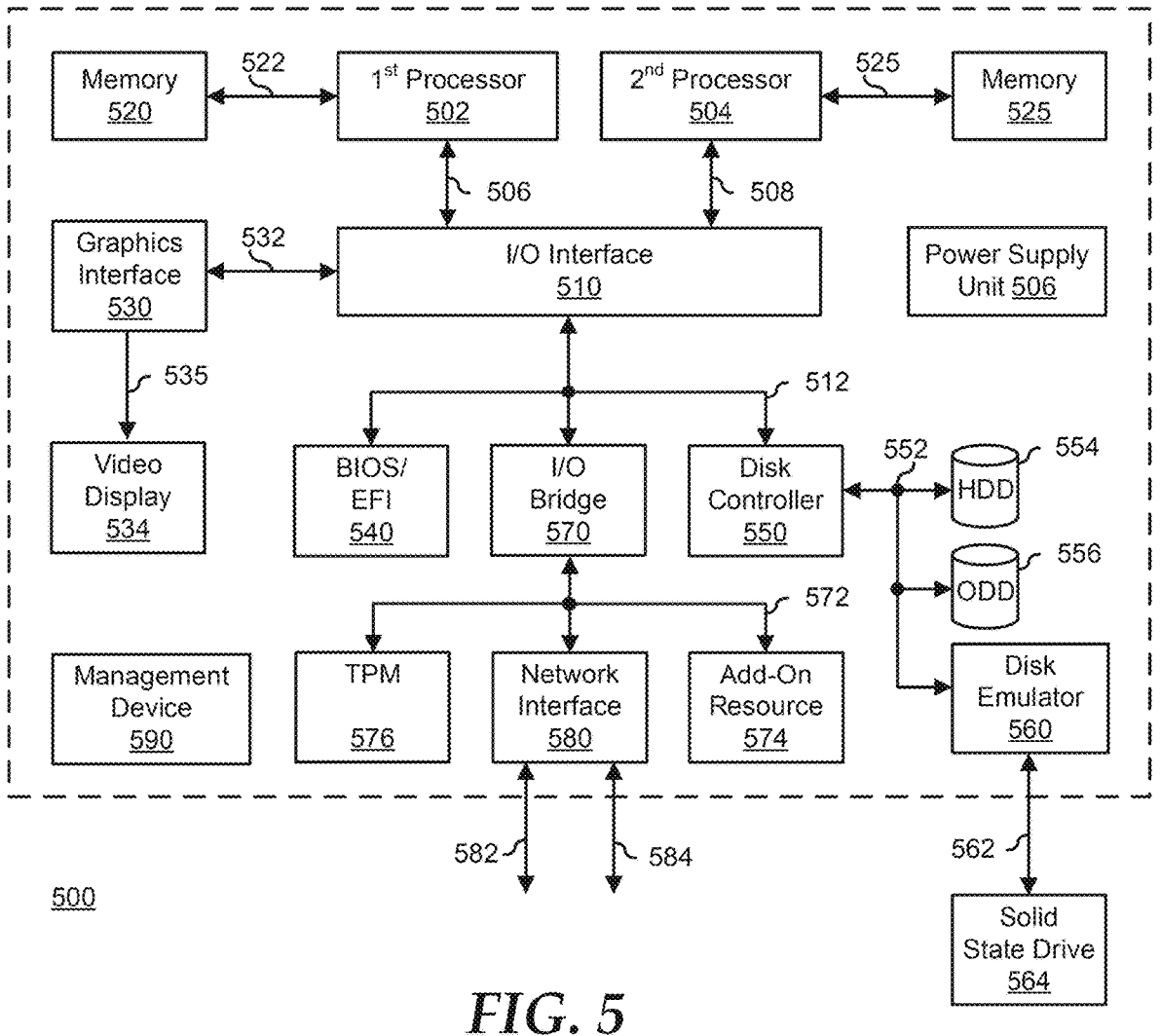
FIG. 5 is a block diagram of a general information handling system according to an embodiment of the present disclosure.

FIG. 5 shows a generalized embodiment of an information handling system 500 according to an embodiment of the present disclosure. Information handling system 500 may be substantially similar to information handling system 100 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below and operates to perform one or more of the methods described below. Information handling system 500 includes a processors 502 and 504, a power supply unit 506, an input/output (I/O) interface 510, memories 520 and 525, a graphics interface 530, a basic input and output system/ universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In an example, power supply unit 506 may provide power to the different components of information handling system 500. In the host environment, processor 502 is connected to I/O interface 510 via processor interface 506, and processor

504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532 and provides a video display output 536 to a video display 534. In a particular embodiment, information handling system 500 includes separate memories that are dedicated to each of processors 502 and 504 via separate memory interfaces. An example of memories 520 and 530 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 5394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512 or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500.

Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
first and second add-in cards, the first add-in card to connect with a host system of the information handling system via a direct connection; and
a riser printed circuit board (PCB) including first and second connectors, the first add-in card in electrical communication with the riser PCB via the first connector, and the second add-in card in electrical communication with the riser PCB via the second connector, wherein the first and second add-in cards to communicate with each other via the first and second connectors and routing on the riser PCB, wherein the second add-in card to communicate with the host system via the first and second connectors, routing on the riser PCB, and the direct connection from a third connector on the first add-in card to the host system.

2. The information handling system of claim 1, wherein the first add-in card includes a third connector, wherein the first add-in card is to communicate with the host system via the third connector and a cable.

3. The information handling system of claim 2, wherein the third connector and the cable include multiple peripheral interconnect express lanes.

4. The information handling system of claim 1, wherein the riser PCB is to provide power to the first add-in card via the first connector and provide the power to the second add-in card via the second connector.

5. The information handling system of claim 1, wherein the first and second connectors on mounted on a same surface of the riser PCB.

6. The information handling system of claim 1, wherein the first and second connectors on mounted on opposite surfaces of the riser PCB.

7. The information handling system of claim 1, wherein the first add-in card is a field programmable gate array card.

8. The information handling system of claim 7, wherein the second add-in card is a system on a chip card.

9. A method comprising:
providing, via first and second connectors on a riser printed circuit board (PCB) of an information handling system, a first communication from a first add-in card of the information handling system to a second add-in card of the information handling system;
providing, via a direct link from a third connector on the first add-in card, a second communication from the first add-in card to a host system of the information handling system; and
providing, via the first and second connectors on the riser PCB and the direct link of the third connector on the first add-in card, a third communication from the second add-in card to the host system of the information handling system.

10. The method of claim 9, the providing of the first communication includes: routing the first communication through a routing on the riser PCB.

11. The method of claim 9, further comprise: providing, via the riser PCB, power to both of the first and second add-in cards.

12. The method of claim 9, wherein only the first add-in card has a direct link to the host system of the information handling system.

13. The method of claim 9, wherein a direct link is via a peripheral component interconnect express cable.

14. The method of claim 9, wherein the first add-in card is a field programmable gate array card.

15. The method of claim 14, wherein the second add-in card is a system on a chip card.

16. An information handling system comprising:
a riser printed circuit board (PCB) including first and second connectors;
a first add-in card including a third connector, the first add-in card in electrical communication with the riser PCB via the first connector, wherein the first add-in card is to connect with a host system of the information handling system via a direct connection through the third connector; and
a second add-in card in electrical communication with the riser PCB via the second connector, wherein the first and second add-in cards to communicate with each other via the first and second connectors and routing on the riser PCB, wherein the second add-in card to communicate with the host system via the first and second connectors, routing on the riser PCB, and the third connector, wherein the first and second add-in cards are in a first configuration when the first and second connectors on mounted on a same surface of the riser PCB, wherein the first and second add-in cards are in a second configuration when the first and second connectors on mounted on opposite surfaces of the riser PCB.

17. The information handling system of claim 16, wherein the third connector and a cable include multiple peripheral interconnect express lanes.

18. The information handling system of claim 16, wherein the riser PCB is to provide power to the first add-in card via the first connector and provide the power to the second add-in card via the second connector.

19. The information handling system of claim 16, wherein the first add-in card is a field programmable gate array card.

20. The information handling system of claim 19, wherein the second add-in card is a system on a chip card.

* * * * *